United States Patent
Khlat et al.

(10) Patent No.: US 9,450,539 B2
(45) Date of Patent: Sep. 20, 2016

(54) COMMUNICATIONS BASED ADJUSTMENTS OF AN OFFSET CAPACITIVE VOLTAGE

(71) Applicant: RF Micro Devices, Inc., Greensboro, NC (US)

(72) Inventors: Nadim Khlat, Cugnaux (FR); Michael R. Kay, Summerfield, NC (US); Manbir Singh Nag, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/163,256

(22) Filed: Jan. 24, 2014

(65) Prior Publication Data

US 2014/0203869 A1  Jul. 24, 2014

Related U.S. Application Data

(60) Provisional application No. 61/756,248, filed on Jan. 24, 2013.

(51) Int. Cl.
*H01Q 11/12* (2006.01)
*H04B 1/04* (2006.01)
*H03F 3/189* (2006.01)
*H03F 1/02* (2006.01)
(Continued)

(52) U.S. Cl.
CPC .......... *H03F 1/0227* (2013.01); *H03F 1/0266* (2013.01); *H03F 3/195* (2013.01); *H03F 3/24* (2013.01); *H02M 2001/0045* (2013.01); *H03F 2200/375* (2013.01); *H03F 2200/432* (2013.01); *H03F 2200/451* (2013.01); *H03F 2200/471* (2013.01); *H03F 2200/555* (2013.01)

(58) Field of Classification Search
CPC ............ H03F 3/189; H03F 2200/432; H03F 2200/451; H03F 2200/471; H03F 1/0227; H03F 1/0266; H03F 3/195; H03F 3/24; H03F 2200/555; H03F 2200/375; H02M 2001/0045
USPC ............ 455/127.2, 127.3, 127.1, 127.4, 102, 455/108; 330/127, 75
See application file for complete search history.

(56) References Cited

U.S. PATENT DOCUMENTS 3,969,682 A  7/1976 Rossum
3,980,964 A  9/1976 Grodinsky
(Continued)

FOREIGN PATENT DOCUMENTS

CN  1076567 A  9/1993
CN  1211355 A  3/1999
(Continued)

OTHER PUBLICATIONS

Non-Final Office Action for U.S. Appl.No. 14/022,940, mailed Dec. 20, 2013, 5 pages.
(Continued)

*Primary Examiner* — Pablo Tran
(74) *Attorney, Agent, or Firm* — Withrow & Terranova, P.L.L.C.

(57) ABSTRACT

A parallel amplifier and an offset capacitance voltage control loop are disclosed. The parallel amplifier has a parallel amplifier output, which is coupled to an envelope tracking power supply output via an offset capacitive element. The offset capacitive element has an offset capacitive voltage. The offset capacitance voltage control loop regulates the offset capacitive voltage, which is adjustable on a communications slot-to-communications slot basis.

28 Claims, 11 Drawing Sheets

(51) Int. Cl.
*H03F 3/195* (2006.01)
*H03F 3/24* (2006.01)
*H02M 1/00* (2006.01)

(56) References Cited

U.S. PATENT DOCUMENTS

| | | | |
|---|---|---|---|
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |
| 5,317,217 A | 5/1994 | Rieger et al. | |
| 5,339,041 A | 8/1994 | Nitardy | |
| 5,351,087 A | 9/1994 | Christopher et al. | |
| 5,414,614 A | 5/1995 | Fette et al. | |
| 5,420,643 A | 5/1995 | Romesburg et al. | |
| 5,457,620 A | 10/1995 | Dromgoole | |
| 5,486,871 A | 1/1996 | Filliman et al. | |
| 5,532,916 A | 7/1996 | Tamagawa | |
| 5,541,547 A | 7/1996 | Lam | |
| 5,581,454 A | 12/1996 | Collins | |
| 5,646,621 A | 7/1997 | Cabler et al. | |
| 5,715,526 A | 2/1998 | Weaver, Jr. et al. | |
| 5,767,744 A | 6/1998 | Irwin et al. | |
| 5,822,318 A | 10/1998 | Tiedemann, Jr. et al. | |
| 5,898,342 A | 4/1999 | Bell | |
| 5,905,407 A | 5/1999 | Midya | |
| 5,936,464 A | 8/1999 | Grondahl | |
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,118,343 A | 9/2000 | Winslow | |
| 6,133,777 A | 10/2000 | Savelli | |
| 6,141,541 A | 10/2000 | Midya et al. | |
| 6,147,478 A | 11/2000 | Skelton et al. | |
| 6,166,598 A | 12/2000 | Schlueter | |
| 6,198,645 B1 | 3/2001 | Kotowski et al. | |
| 6,204,731 B1 | 3/2001 | Jiang et al. | |
| 6,256,482 B1 | 7/2001 | Raab | |
| 6,300,826 B1 | 10/2001 | Mathe et al. | |
| 6,313,681 B1 | 11/2001 | Yoshikawa | |
| 6,348,780 B1 | 2/2002 | Grant | |
| 6,400,775 B1 | 6/2002 | Gourgue et al. | |
| 6,483,281 B2 | 11/2002 | Hwang | |
| 6,559,689 B1 | 5/2003 | Clark | |
| 6,566,935 B1 | 5/2003 | Renous | |
| 6,583,610 B2 | 6/2003 | Groom et al. | |
| 6,617,930 B2 | 9/2003 | Nitta | |
| 6,621,808 B1 | 9/2003 | Sadri | |
| 6,624,712 B1 | 9/2003 | Cygan et al. | |
| 6,646,501 B1 | 11/2003 | Wessel | |
| 6,658,445 B1 | 12/2003 | Gau et al. | |
| 6,681,101 B1 | 1/2004 | Eidson et al. | |
| 6,686,727 B2 | 2/2004 | Ledenev et al. | |
| 6,690,652 B1 | 2/2004 | Sadri | |
| 6,701,141 B2 | 3/2004 | Lam | |
| 6,703,080 B2 | 3/2004 | Reyzelman et al. | |
| 6,728,163 B2 | 4/2004 | Gomm et al. | |
| 6,744,151 B2 | 6/2004 | Jackson et al. | |
| 6,819,938 B2 | 11/2004 | Sahota | |
| 6,885,176 B2 | 4/2005 | Librizzi | |
| 6,958,596 B1 | 10/2005 | Sferrazza et al. | |
| 6,995,995 B2 | 2/2006 | Zeng et al. | |
| 7,038,536 B2 | 5/2006 | Cioffi et al. | |
| 7,043,213 B2 | 5/2006 | Robinson et al. | |
| 7,053,718 B2 | 5/2006 | Dupuis et al. | |
| 7,058,373 B2 | 6/2006 | Grigore | |
| 7,099,635 B2 | 8/2006 | McCune | |
| 7,164,893 B2 | 1/2007 | Leizerovich et al. | |
| 7,170,341 B2 | 1/2007 | Conrad et al. | |
| 7,200,365 B2 | 4/2007 | Watanabe et al. | |
| 7,233,130 B1 | 6/2007 | Kay | |
| 7,253,589 B1 | 8/2007 | Potanin et al. | |
| 7,254,157 B1 | 8/2007 | Crotty et al. | |
| 7,262,658 B2 | 8/2007 | Ramaswamy et al. | |
| 7,279,875 B2 | 10/2007 | Gan et al. | |
| 7,304,537 B2 | 12/2007 | Kwon et al. | |
| 7,348,847 B2 | 3/2008 | Whittaker | |
| 7,394,233 B1 | 7/2008 | Trayling et al. | |
| 7,405,618 B2 | 7/2008 | Lee et al. | |
| 7,411,316 B2 | 8/2008 | Pai | |
| 7,414,330 B2 | 8/2008 | Chen | |
| 7,453,711 B2 | 11/2008 | Yanagida et al. | |
| 7,454,238 B2 | 11/2008 | Vinayak et al. | |
| 7,515,885 B2 | 4/2009 | Sander et al. | |
| 7,528,807 B2 | 5/2009 | Kim et al. | |
| 7,529,523 B1 | 5/2009 | Young et al. | |
| 7,539,466 B2 | 5/2009 | Tan et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,653,366 B2 | 1/2010 | Grigore | |
| 7,679,433 B1 * | 3/2010 | Li | 330/10 |
| 7,684,216 B2 | 3/2010 | Choi et al. | |
| 7,696,735 B2 | 4/2010 | Oraw et al. | |
| 7,715,811 B2 | 5/2010 | Kenington | |
| 7,724,837 B2 | 5/2010 | Filimonov et al. | |
| 7,755,431 B2 * | 7/2010 | Sun | 330/297 |
| 7,764,060 B2 | 7/2010 | Wilson | |
| 7,773,691 B2 | 8/2010 | Khlat et al. | |
| 7,773,965 B1 | 8/2010 | Van Brunt et al. | |
| 7,777,459 B2 | 8/2010 | Williams | |
| 7,782,036 B1 | 8/2010 | Wong et al. | |
| 7,783,269 B2 | 8/2010 | Vinayak et al. | |
| 7,800,427 B2 | 9/2010 | Chae et al. | |
| 7,805,115 B1 | 9/2010 | McMorrow et al. | |
| 7,852,150 B1 | 12/2010 | Arknaes-Pedersen | |
| 7,856,048 B1 | 12/2010 | Smaini et al. | |
| 7,859,336 B2 | 12/2010 | Markowski et al. | |
| 7,880,547 B2 | 2/2011 | Lee et al. | |
| 7,884,681 B1 | 2/2011 | Khlat et al. | |
| 7,894,216 B2 | 2/2011 | Melanson | |
| 7,898,268 B2 | 3/2011 | Bernardon et al. | |
| 7,898,327 B2 | 3/2011 | Nentwig | |
| 7,907,010 B2 | 3/2011 | Wendt et al. | |
| 7,915,961 B1 | 3/2011 | Li | |
| 7,917,105 B2 | 3/2011 | Drogi et al. | |
| 7,920,023 B2 | 4/2011 | Witchard | |
| 7,923,974 B2 | 4/2011 | Martin et al. | |
| 7,965,140 B2 | 6/2011 | Takahashi | |
| 7,994,864 B2 | 8/2011 | Chen et al. | |
| 8,000,117 B2 | 8/2011 | Petricek | |
| 8,008,970 B1 | 8/2011 | Homol et al. | |
| 8,022,761 B2 | 9/2011 | Drogi et al. | |
| 8,026,765 B2 | 9/2011 | Giovannotto | |
| 8,044,639 B2 | 10/2011 | Tamegai et al. | |
| 8,054,126 B2 * | 11/2011 | Yang et al. | 330/124 R |
| 8,068,622 B2 | 11/2011 | Melanson et al. | |
| 8,081,199 B2 | 12/2011 | Takata et al. | |
| 8,093,951 B1 | 1/2012 | Zhang et al. | |
| 8,159,297 B2 | 4/2012 | Kumagai | |
| 8,164,388 B2 | 4/2012 | Iwamatsu | |
| 8,174,313 B2 | 5/2012 | Vice | |
| 8,183,917 B2 | 5/2012 | Drogi et al. | |
| 8,183,929 B2 | 5/2012 | Grondahl | |
| 8,198,941 B2 | 6/2012 | Lesso | |
| 8,204,456 B2 | 6/2012 | Xu et al. | |
| 8,242,813 B1 | 8/2012 | Wile et al. | |
| 8,253,485 B2 * | 8/2012 | Clifton | 330/51 |
| 8,253,487 B2 * | 8/2012 | Hou et al. | 330/127 |
| 8,274,332 B2 | 9/2012 | Cho et al. | |
| 8,289,084 B2 | 10/2012 | Morimoto et al. | |
| 8,358,113 B2 | 1/2013 | Cheng et al. | |
| 8,362,837 B2 | 1/2013 | Koren et al. | |
| 8,446,135 B2 | 5/2013 | Chen et al. | |
| 8,493,141 B2 | 7/2013 | Khlat et al. | |
| 8,519,788 B2 | 8/2013 | Khlat | |
| 8,541,993 B2 | 9/2013 | Notman et al. | |

(56) References Cited

U.S. PATENT DOCUMENTS

| | | |
|---|---|---|
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 * | 2/2014 | Henshaw et al. ............. 330/127 |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 * | 6/2014 | Hou et al. ................... 455/127.1 |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 * | 9/2014 | Briffa et al. ................. 455/102 |
| 8,829,993 B2 * | 9/2014 | Briffa et al. ................. 330/136 |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 * | 3/2015 | Balteanu ...................... 330/136 |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |

(56) References Cited

U.S. PATENT DOCUMENTS

| | | |
|---|---|---|
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0149169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1518209 A | 8/2004 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

Dixon, N., "Standardisation Boosts Momentum for Envelope Tracking," Microwave Engineering, Europe, Apr. 20, 2011, 2 pages,

(56) References Cited

OTHER PUBLICATIONS http://www.mwee.com/en/standardisation-boosts-momentum-for-envelope-tracking.html?cmp_ids=71&news_ids=222901746.

Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

Non-final Office Action for U.S. Appl. No. 11/113,873, now U.S. Pat. No. 7,773,691, mailed Feb. 1, 2008, 17 pages.

Final Office Action for U.S. Appl. No. 11/113,873, now U.S. Pat. No. 7,773,691, mailed Jul. 30, 2008, 19 pages.

Non-final Office Action for U.S. Appl. No. 11/113,873, now U.S. Pat. No. 7,773,691, mailed Nov. 26, 2008, 22 pages.

Final Office Action for U.S. Appl. No. 11/113,873, now U.S. Pat. No. 7,773,691, mailed May 4, 2009, 20 pages.

Non-final Office Action for U.S. Appl. No. 11/113,873, now U.S. Pat. No. 7,773,691, mailed Feb. 3, 2010, 21 pages.

Notice of Allowance for U.S. Appl. No. 11/113,873, now U.S. Pat. No. 7,773,691, mailed Jun. 9, 2010, 7 pages.

International Search Report for PCT/US06/12619, mailed May 8, 2007, 2 pages.

Extended European Search Report for application 06740532.4, mailed Dec. 7, 2010, 7 pages.

Non-final Office Action for U.S. Appl. No. 12/112,006, mailed Apr. 5, 2010, 6 pages.

Notice of Allowance for U.S. Appl. No. 12/112,006, mailed Jul. 19, 2010, 6 pages.

Non-Final Office Action for U.S. Appl. No. 12/836,307, mailed Nov. 5, 2013, 6 pages.

Notice of Allowance for U.S. Appl. No. 12/836,307, mailed May 5, 2014, 6 pages.

Non-final Office Action for U.S. Appl. No. 13/089,917, mailed Nov. 23, 2012, 6 pages.

Examination Report for European Patent Application No. 11720630, mailed Aug. 16, 2013, 5 pages.

Examination Report for European Patent Application No. 11720630.0, issued Mar. 18, 2014, 4 pages.

European Search Report for European Patent Application No. 14162682.0, issued Aug. 27, 2014, 7 pages.

International Search Report for PCT/US11/033037, mailed Aug. 9, 2011, 10 pages.

International Preliminary Report on Patentability for PCT/US2011/033037, mailed Nov. 1, 2012, 7 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 8 pages.

International Search Report for PCT/US2011/044857, mailed Oct. 24, 2011, 10 pages.

International Preliminary Report on Patentability for PCT/US2011/044857, mailed Mar. 7, 2013, 6 pages.

Non-final Office Action for U.S. Appl. No. 13/218,400, mailed Nov. 8, 2012, 7 pages.

Notice of Allowance for U.S. Appl. No. 13/218,400, mailed Apr. 11, 2013, 7 pages.

International Search Report for PCT/US11/49243, mailed Dec. 22, 2011, 9 pages.

International Preliminary Report on Patentability for PCT/US11/49243, mailed Nov. 13, 2012, 33 pages.

International Search Report for PCT/US2011/054106, mailed Feb. 9, 2012, 11 pages.

International Preliminary Report on Patentability for PCT/US2011/054106, mailed Apr. 11, 2013, 8 pages.

Notice of Allowance for U.S. Appl. No. 13/297,490, mailed Feb. 27, 2014, 7 pages.

Invitation to Pay Additional Fees for PCT/US2011/061007, mailed Feb. 13, 2012, 7 pages.

International Search Report for PCT/US2011/061007, mailed Aug. 16, 2012, 16 pages.

International Preliminary Report on Patentability for PCT/US2011/061007, mailed May 30, 2013, 11 pages.

Non-Final Office Action for U.S. Appl. No. 13/297,470, mailed May 8, 2013, 15 pages.

Notice of Allowance for U.S. Appl. No. 13/948,291, mailed Feb. 11, 2015, 7 pages.

First Office Action for Chinese Patent Application No. 201180030273.5, issued Dec. 3, 2014, 15 pages (with English translation).

Notice of Allowance for U.S. Appl. No. 14/022,858, mailed Feb. 17, 2015, 7 pages.

Notice of Allowance for U.S. Appl. No. 14/072,225, mailed Jan. 22, 2015, 7 pages.

Final Office Action for U.S. Appl. No. 13/661,227, mailed Feb. 6, 2015, 24 pages.

International Preliminary Report on Patentability for PCT/US2013/052277, mailed Feb. 5, 2015, 9 pages.

Non-Final Office Action for U.S. Appl. No. 14/048,109, mailed Feb. 18, 2015, 8 pages.

Notice of Allowance for U.S. Appl. No. 13/747,725, mailed Feb. 2, 2015, 10 pages.

(56) References Cited

OTHER PUBLICATIONS

Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Notice of Allowance for U.S. Appl. No. 14/072,140, mailed Dec. 2, 2014, 8 pages.
First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.

(56) References Cited

OTHER PUBLICATIONS

International Search Report and Written Opinion for PCT/US2014/028178, mailed Sep. 30, 2014, 17 pages.
European Search Report for European Patent Application No. 14190851.7, issued Mar. 5, 2015, 6 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US20141028178, mailed Jul. 24, 2014, 7 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Yun, Hu et al., "Study of envelope tracking power amplifier design," Journal of Circuits and Systems, vol. 15, No. 6, Dec. 2010, pp. 6-10.
First Office Action and Search Report for Chinese Patent Application No. 2012800079417, issued May 13, 2015, 13 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.

(56) References Cited

OTHER PUBLICATIONS

Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Non-Final Office Action for U.S. Appl. No. 14/458,341, mailed Nov. 12, 2015, 5 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Non-Final Office Action for U.S. Appl. No. 14/254,215, mailed Oct. 15, 2015, 5 pages.
Notice of Allowance for U.S. Appl. No. 13/661,164, mailed Oct. 21, 2015, 7 pages.
First Office Action for Chinese Patent Application No. 201280042523.1, issued Dec. 4, 2015, 12 pages.
Notice of Allowance for U.S. Appl. No. 14/072,225, mailed Feb. 3, 2016, 7 pages.
Final Office Action for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Examination Report for European Patent Application No. 14190851.7, mailed May 2, 2016, 5 pages.
Advisory Action for U.S. Appl. No. 13/689,883, mailed Mar. 4, 2016, 3 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Notice of Allowance for U.S. Appl. No. 14/458,341, mailed Feb. 18, 2016, 6 pages.
Non-Final Office Action for U.S. Appl. No. 13/689,883, mailed Apr. 20, 2016, 13 pages.
Non-Final Office Action for U.S. Appl. No. 13/714,600, mailed May 4, 2016, 14 pages.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Combined Search and Examination Report for European Patent Application No. 12725911.7, mailed Jun. 15, 2016, 14 pages.
Notice of Allowance and Examiner Initiated Interview Summary for U.S. Appl. No. 13/661,227, mailed May 13, 2016, 10 pages.
Final Office Action for U.S. Appl. No. 13/876,518, mailed Jun. 2, 2016, 14 pages.

\* cited by examiner

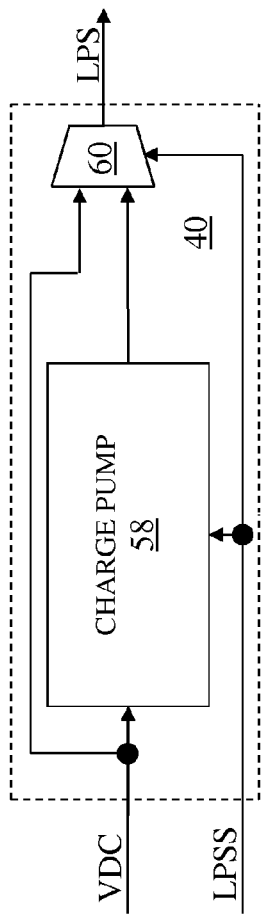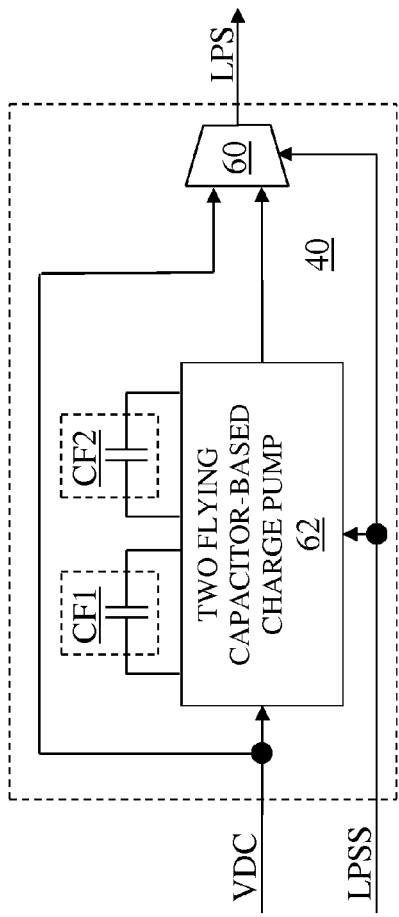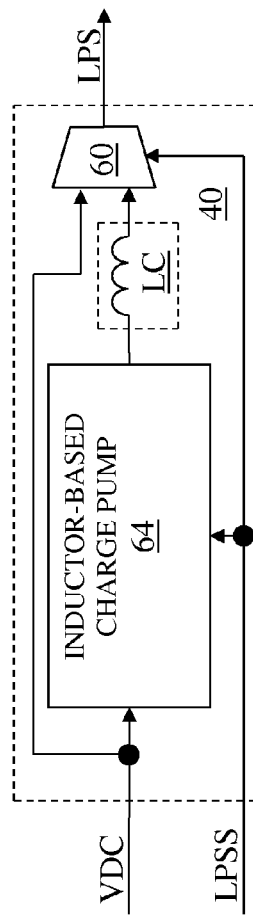

COMMUNICATIONS BASED ADJUSTMENTS OF AN OFFSET CAPACITIVE VOLTAGE

RELATED APPLICATIONS

This application claims the benefit of U.S. provisional patent application No. 61/756,248, filed Jan. 24, 2013, the disclosure of which is incorporated herein by reference in its entirety.

This application is related to U.S. Pat. No. 9,300,252 entitled COMMUNICATIONS BASED ADJUSTMENTS OF A PARALLEL AMPLIFIER POWER SUPPLY by Khlat et al, filed Jan. 24, 2014, which is incorporated herein by reference in its entirety.

FIELD OF THE DISCLOSURE

Embodiments of the present disclosure relate to switching power supplies, analog power supplies, and radio frequency (RF) power amplifiers, any or all of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

A parallel amplifier and an offset capacitance voltage control loop are disclosed according to one embodiment of the present disclosure. The parallel amplifier has a parallel amplifier output, which is coupled to an envelope tracking power supply output via an offset capacitive element. The offset capacitive element has an offset capacitive voltage. The offset capacitance voltage control loop regulates the offset capacitive voltage, which is adjustable on a communications slot-to-communications slot basis.

In one embodiment of the present disclosure, an envelope tracking power supply includes the envelope tracking power supply output, the parallel amplifier, the offset capacitance voltage control loop, switching circuitry, the offset capacitive element, and a first inductive element. The envelope tracking power supply provides an envelope power supply voltage to an RF power amplifier via the envelope tracking power supply output. As such, during envelope tracking, the envelope power supply voltage at least partially envelope tracks an RF transmit signal from the RF power amplifier. By adjusting the offset capacitive voltage on a communications slot-to-communications slot basis, efficiency of the envelope tracking power supply may be optimized.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 9A, 9B, and 9C show details of three different embodiments, respectively, of the parallel amplifier power supply illustrated in FIG. 4.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A parallel amplifier and an offset capacitance voltage control loop are disclosed according to one embodiment of the present disclosure. The parallel amplifier has a parallel amplifier output, which is coupled to an envelope tracking power supply output via an offset capacitive element. The offset capacitive element has an offset capacitive voltage. The offset capacitance voltage control loop regulates the offset capacitive voltage, which is adjustable on a communications slot-to-communications slot basis.

In one embodiment of the present disclosure, an envelope tracking power supply includes the envelope tracking power supply output, the parallel amplifier, the offset capacitance voltage control loop, switching circuitry, the offset capacitive element, and a first inductive element. The envelope tracking power supply provides an envelope power supply voltage to an RF power amplifier via the envelope tracking power supply output. As such, during envelope tracking, the envelope power supply voltage at least partially envelope tracks an RF transmit signal from the RF power amplifier. By adjusting the offset capacitive voltage on a communications slot-to-communications slot basis, efficiency of the envelope tracking power supply may be optimized.

Figure 1:
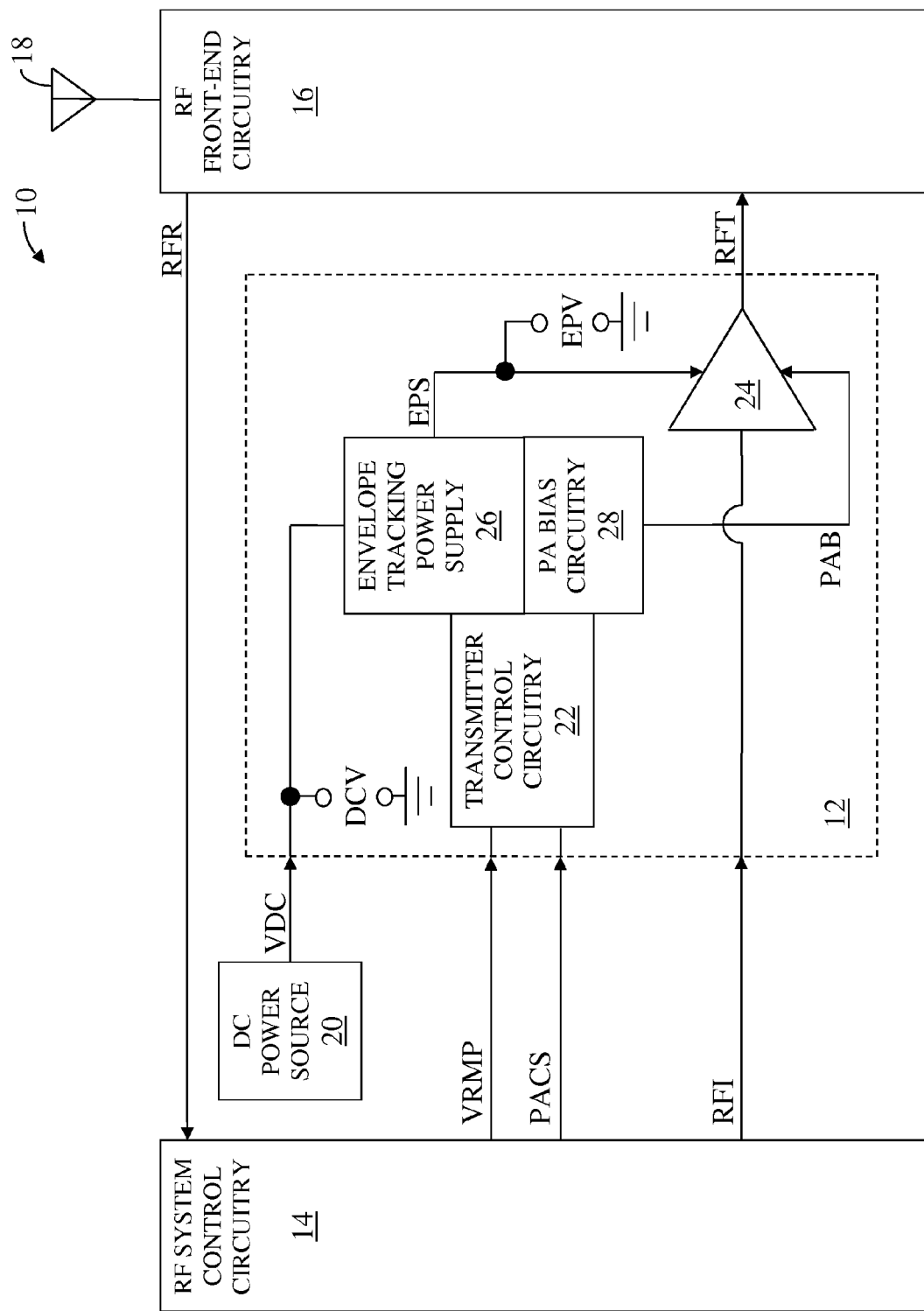
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. The DC source signal VDC has a DC source voltage DCV. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The envelope power supply signal EPS has an envelope power supply voltage EPV. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

In this regard, in one embodiment of the RF communications system 10, the RF communications system 10 communicates with other RF communications systems (not shown) using multiple communications slots, which may include transmit communications slots, receive communications slots, simultaneous receive and transmit communications slots, or any combination thereof. Such communications slots may utilize the RF transmit signal RFT, the RF receive signal RFR, other RF signals (not shown), or any combination thereof. In one embodiment of an RF communications slot, the RF communications slot is a time period during which RF transmissions, RF receptions, or both, may occur. Adjacent RF communications slots may be separated by slot boundaries, in which RF transmissions, RF receptions, or both, may be prohibited. As a result, during the slot boundaries, the RF communications system 10 may prepare for RF transmissions, RF receptions, or both.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
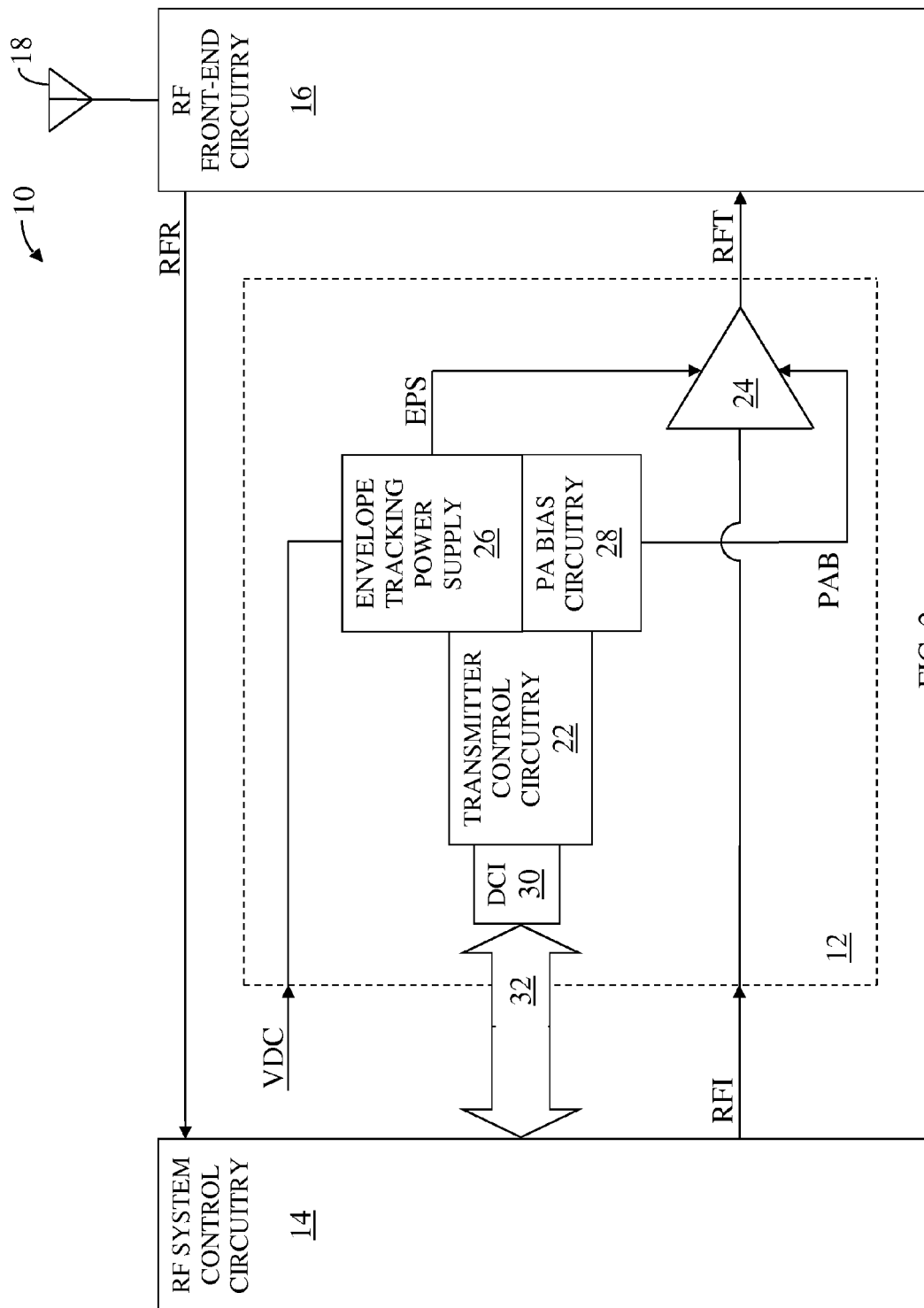
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
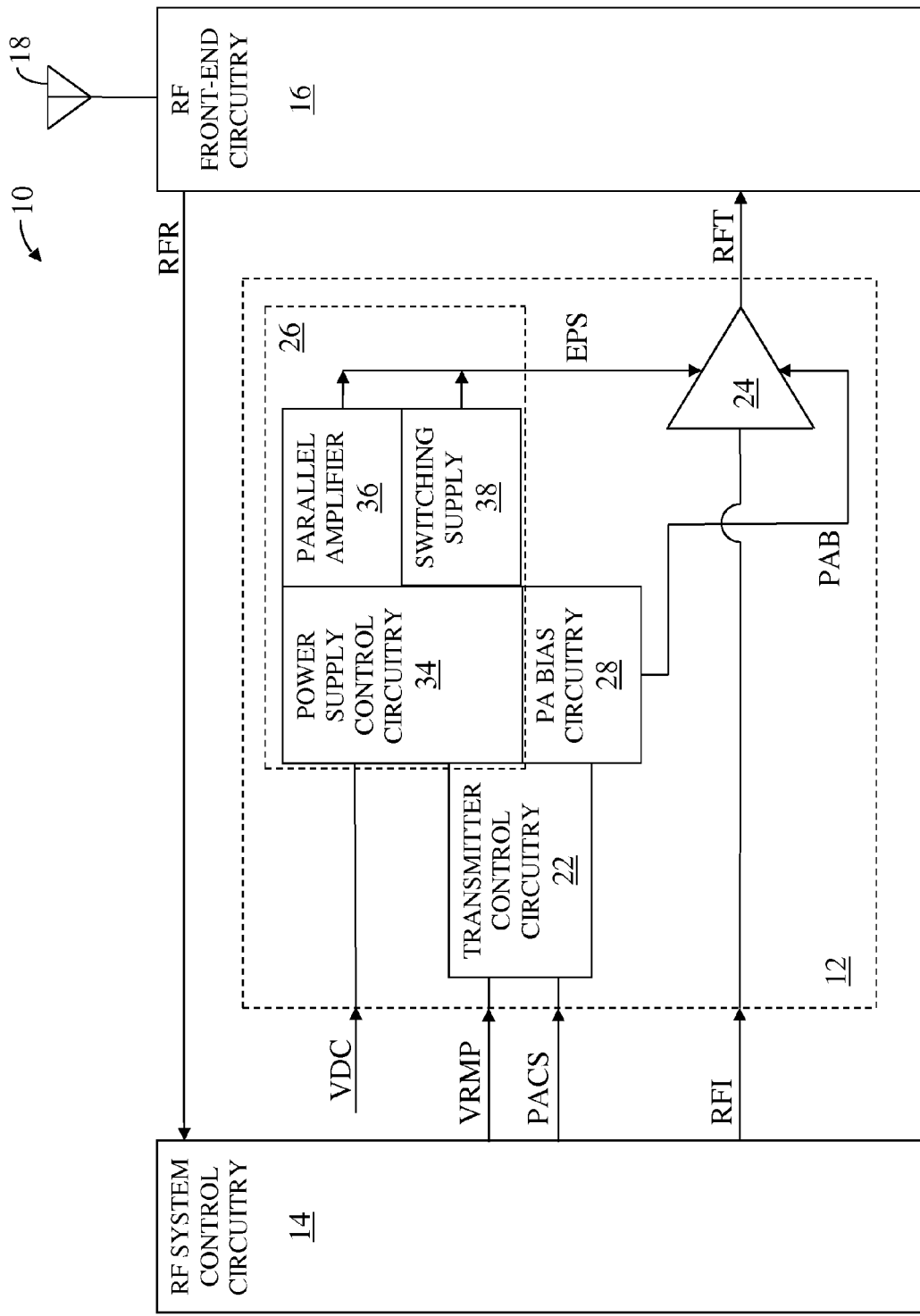
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a parallel amplifier 36, and a switching supply 38. The power supply control circuitry 34 is coupled to the transmitter control circuitry 22, the parallel amplifier 36 is coupled to the power supply control circuitry 34, and the switching supply 38 is coupled to the power supply control circuitry 34. The transmitter control circuitry 22 may forward the envelope power supply control signal VRMP to the power supply control circuitry 34.

Since the envelope power supply control signal VRMP is representative of the setpoint of the envelope power supply signal EPS, the power supply control circuitry 34 controls the parallel amplifier 36 and the switching supply 38 based on the setpoint of the envelope power supply signal EPS. The parallel amplifier 36 and the switching supply 38 provide the envelope power supply signal EPS, such that the parallel amplifier 36 partially provides the envelope power supply signal EPS and the switching supply 38 partially provides the envelope power supply signal EPS. The switching supply 38 may provide power more efficiently than the parallel amplifier 36. However, the parallel amplifier 36 may provide the envelope power supply signal EPS more accurately than the switching supply 38. As such, the parallel amplifier 36 regulates the envelope power supply voltage EPV (FIGS. 1 and 7) based on the setpoint of the envelope power supply voltage EPV (FIGS. 1 and 7), and the switching supply 38 operates to drive an output current from the parallel amplifier 36 toward zero to maximize efficiency. In this regard, the parallel amplifier 36 behaves like a voltage source and the switching supply 38 behaves like a current source.

Figure 7:
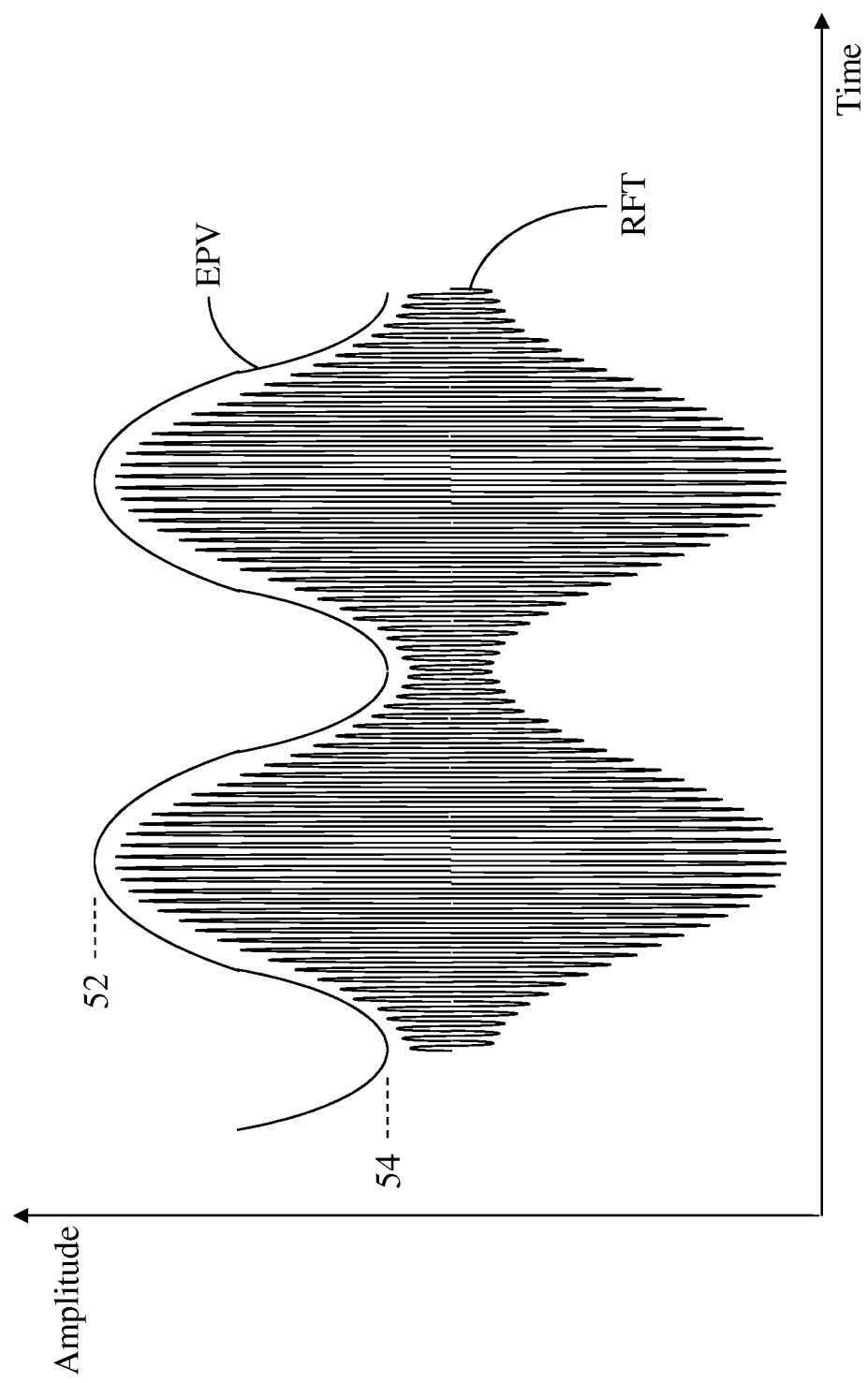
FIG. 7 is a graph illustrating an RF transmit signal and an envelope power supply voltage shown in FIGS. 1 and 4, respectively, according to one embodiment of the RF transmit signal and the envelope power supply voltage.

As previously mentioned, in one embodiment of the RF communications system 10, the RF PA 24 receives and amplifies the RF input signal RFI to provide the RF transmit signal RFT using the envelope power supply signal EPS, which provides power for amplification. In one embodiment of the RF input signal RFI, the RF input signal RFI is amplitude modulated. As such, the RF transmit signal RFT is also amplitude modulated, as illustrated in FIG. 7. Since the amplitude of the RF transmit signal RFT is modulated, the amplitude of the RF transmit signal RFT traverses within an envelope of the RF transmit signal RFT. For proper operation of the RF PA 24, the envelope power supply voltage EPV (FIGS. 1 and 7) must be high enough to accommodate the envelope of the RF transmit signal RFT. However, to increase efficiency in the RF PA 24, the envelope power supply voltage EPV (FIGS. 1 and 7) may at least partially track the envelope of the RF transmit signal RFT. This tracking by the envelope power supply voltage EPV is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply voltage EPV (FIGS. 1 and 7) to be amplitude modulated.

In a first embodiment of the envelope power supply control signal VRMP, a bandwidth of the envelope power supply control signal VRMP is greater than about 10 megahertz. In a second embodiment of the envelope power supply control signal VRMP, the bandwidth of the envelope power supply control signal VRMP is greater than about 20 megahertz. In a third embodiment of the envelope power supply control signal VRMP, the bandwidth of the envelope power supply control signal VRMP is greater than about 30 megahertz. In a fourth embodiment of the envelope power supply control signal VRMP, the bandwidth of the envelope power supply control signal VRMP is greater than about 40 megahertz. In a fifth embodiment of the envelope power supply control signal VRMP, the bandwidth of the envelope power supply control signal VRMP is greater than about 50 megahertz. In an alternate embodiment of the envelope power supply control signal VRMP, the bandwidth of the envelope power supply control signal VRMP is less than about 100 megahertz.

Figure 4:
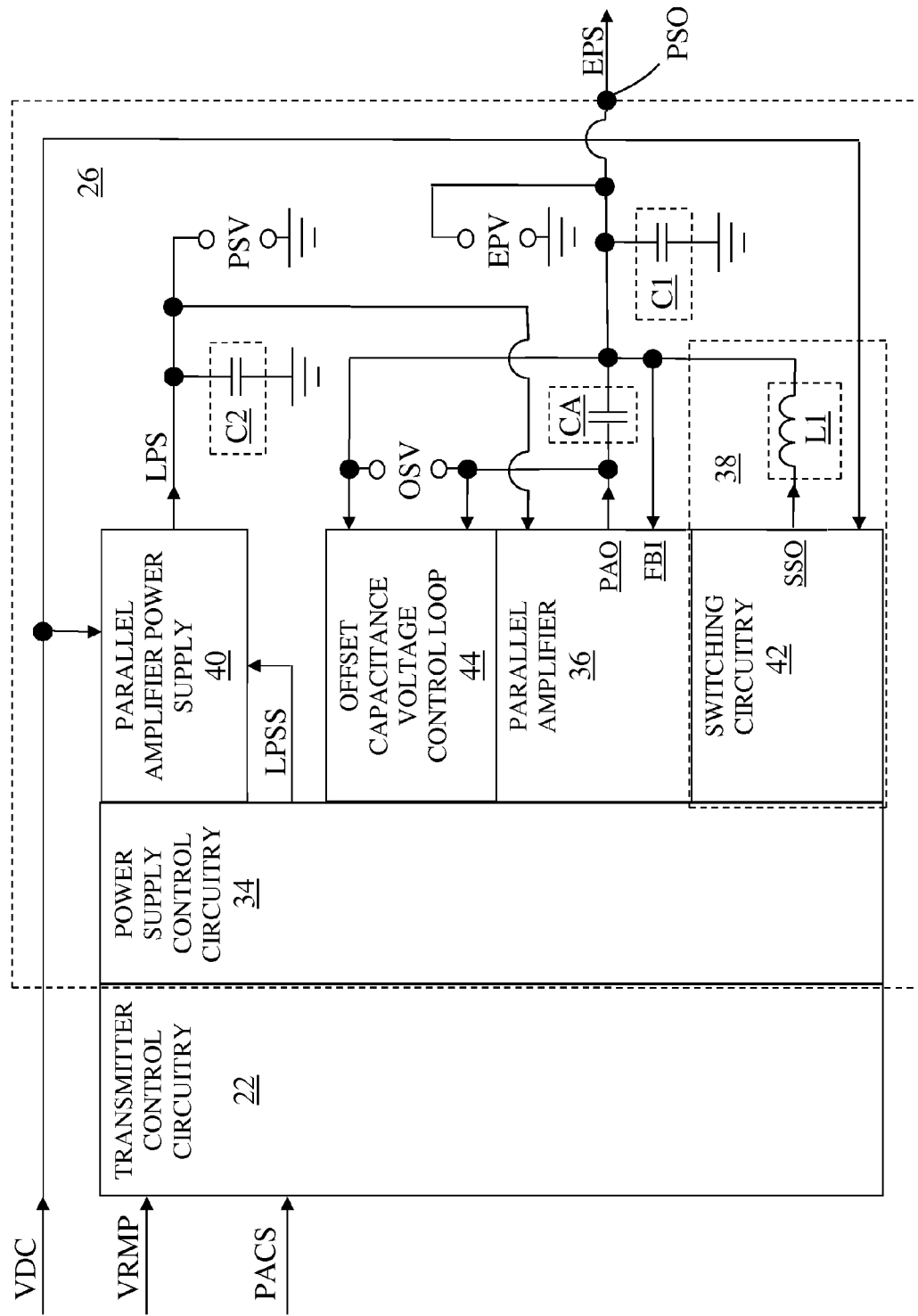
FIG. 4 shows details of the envelope tracking power supply illustrated in FIG. 1 according to an alternate embodiment of the envelope tracking power supply.

FIG. 4 shows details of the envelope tracking power supply 26 illustrated in FIG. 1 according to an alternate embodiment of the envelope tracking power supply 26. The envelope tracking power supply 26 illustrated in FIG. 4 is similar to the envelope tracking power supply 26 illustrated in FIG. 3, except the envelope tracking power supply 26 illustrated in FIG. 4 further includes a parallel amplifier power supply 40, an offset capacitance voltage control loop 44, an offset capacitive element CA, a first filter capacitive element C1, and a second filter capacitive element C2. Additionally, the switching supply 38 includes switching circuitry 42 and a first inductive element L1. The envelope tracking power supply 26 has an envelope tracking power supply output PSO, such that the envelope power supply signal EPS is provided via the envelope tracking power supply output PSO. As previously mentioned, the envelope power supply signal EPS has the envelope power supply voltage EPV. The parallel amplifier 36 has a feedback input FBI and a parallel amplifier output PAO. The switching circuitry 42 has a switching circuitry output SSO.

In the embodiment shown, the first inductive element L1 is directly coupled between the switching circuitry output SSO and the envelope tracking power supply output PSO. In general, the switching circuitry output SSO is coupled to the envelope tracking power supply output PSO via the first inductive element L1. As such, in other embodiments (not shown), the first inductive element L1 is coupled between the switching circuitry output SSO and the envelope tracking power supply output PSO using other intervening elements (not shown).

In the embodiment shown, the offset capacitive element CA is directly coupled between the parallel amplifier output PAO and the envelope tracking power supply output PSO. In general, the parallel amplifier output PAO is coupled to the envelope tracking power supply output PSO via the offset capacitive element CA. As such, in other embodiments (not shown), the offset capacitive element CA is coupled between the parallel amplifier output PAO and the envelope tracking power supply output PSO using other intervening elements (not shown).

In the embodiment shown, the first inductive element L1 is directly coupled between the switching circuitry output SSO and the feedback input FBI. In general, the switching circuitry output SSO is coupled to the feedback input FBI via the first inductive element L1. As such, in other embodiments (not shown), the first inductive element L1 is coupled between the switching circuitry output SSO and the feedback input FBI using other intervening elements (not shown).

In one embodiment of the first filter capacitive element C1, the first filter capacitive element C1 is coupled between the envelope tracking power supply output PSO and a ground. In one embodiment of the second filter capacitive element C2, the second filter capacitive element C2 is coupled between an output from the parallel amplifier power supply 40 and the ground. The parallel amplifier power supply 40 provides a parallel amplifier power supply signal LPS to the parallel amplifier 36 via the output from the parallel amplifier power supply 40. The parallel amplifier power supply signal LPS has a parallel amplifier power supply voltage PSV.

The parallel amplifier 36 receives the parallel amplifier power supply signal LPS and regulates the envelope power supply voltage EPV via the parallel amplifier output PAO based on the setpoint of the envelope power supply voltage EPV using the parallel amplifier power supply signal LPS. As such, the parallel amplifier power supply signal LPS provides power for amplification. In this regard, since the parallel amplifier 36 receives the envelope power supply voltage EPV via the feedback input FBI, the parallel amplifier 36 drives the envelope power supply voltage EPV toward the setpoint of the envelope power supply voltage EPV. In one embodiment of the parallel amplifier 36, during envelope tracking, the parallel amplifier 36 provides the envelope power supply voltage EPV to the RF PA 24 via the envelope tracking power supply output PSO, such that the envelope power supply voltage EPV at least partially tracks the RF transmit signal RFT from the RF PA 24.

In one embodiment of the parallel amplifier power supply 40, the parallel amplifier power supply signal LPS is adjustable on a communications slot-to-communications slot basis. As such, during at least one communications slot 46 (FIG. 6), the parallel amplifier power supply signal LPS is regulated to be about constant. Further, between communications slots 46, 48 (FIG. 6), the parallel amplifier power supply signal LPS may be changed.

An output voltage swing at the parallel amplifier output PAO of the parallel amplifier 36 is approximately between a source headroom voltage SRC (not shown) below the parallel amplifier power supply voltage PSV and a sink headroom voltage SNK (not shown) above the ground. However, during envelope tracking, the envelope power supply voltage EPV may traverse between an expected maximum 52 (FIG. 7) of the envelope power supply voltage EPV and an expected minimum 54 (FIG. 7) of the envelope power supply voltage EPV. Since the parallel amplifier 36 drives the envelope power supply voltage EPV toward the setpoint of the envelope power supply voltage EPV, the parallel amplifier 36 and the offset capacitive element CA must be able to drive between the expected maximum 52 (FIG. 7) of the envelope power supply voltage EPV and the expected minimum 54 (FIG. 7) of the envelope power supply voltage EPV. However, the expected minimum 54 (FIG. 7) of the envelope power supply voltage EPV may be significantly above ground.

In this regard, without the offset capacitive element CA, the parallel amplifier 36 would need an output voltage swing between the expected maximum 52 (FIG. 7) of the envelope power supply voltage EPV and the expected minimum 54 (FIG. 7) of the envelope power supply voltage EPV. When the expected minimum 54 (FIG. 7) of the envelope power supply voltage EPV is significantly above the ground, the voltage drop between the parallel amplifier output PAO and the ground is large, thereby degrading efficiency. However, by using the offset capacitive element CA, the voltage swing between the expected maximum 52 (FIG. 7) of the envelope power supply voltage EPV and the expected minimum 54 (FIG. 7) of the envelope power supply voltage EPV may be shifted down at the parallel amplifier output PAO.

In this regard, to maximize efficiency, the expected minimum 54 (FIG. 7) of the envelope power supply voltage EPV at the envelope tracking power supply output PSO would be shifted down to the sink headroom voltage SNK (not shown) above ground at the parallel amplifier output PAO, and the expected maximum 52 (FIG. 7) of the envelope power supply voltage EPV at the envelope tracking power supply output PSO would be shifted down to the source headroom voltage SRC (not shown) below the parallel amplifier power supply voltage PSV.

In one embodiment of the offset capacitance voltage control loop 44, the offset capacitive element CA has an offset capacitive voltage OSV, which is regulated by the offset capacitance voltage control loop 44. In one embodiment of the offset capacitance voltage control loop 44, the offset capacitive voltage OSV is adjustable on a communications slot-to-communications slot basis. As such, during at least one communications slot 46 (FIG. 6), the offset capacitive voltage OSV is regulated to be about constant. Further, between communications slots 46, 48 (FIG. 6), the offset capacitive voltage OSV may be changed. Further, in one embodiment of the offset capacitance voltage control loop 44, during at least one communications slot 46 (FIG. 6), the offset capacitive voltage OSV is further regulated, such that an average DC current through the offset capacitive element CA is equal to about zero.

If the offset capacitive voltage OSV is too large, then the parallel amplifier 36 will be unable to drive the parallel amplifier output PAO low enough to provide the expected minimum 54 (FIG. 7) of the envelope power supply voltage EPV at the parallel amplifier output PAO. Therefore, in one embodiment of the offset capacitance voltage control loop 44, the offset capacitance voltage control loop 44 regulates the offset capacitive voltage OSV, such that the offset capacitive voltage OSV is less than or equal to a difference between the expected minimum 54 (FIG. 7) of the envelope power supply voltage EPV and the sink headroom voltage SNK (not shown). In one embodiment of the sink headroom voltage SNK (not shown), the sink headroom voltage SNK (not shown) is equal to about 0.2 volts. If the expected minimum 54 (FIG. 7) of the envelope power supply voltage EPV is represented as EMN, the above requirement is shown in EQ. 1, below.

$$OSV<=EMN-SNK \qquad \text{EQ. 1}$$

Additionally, the parallel amplifier power supply 40 must make sure that the parallel amplifier power supply voltage PSV is high enough to provide the expected maximum 52 (FIG. 7) of the envelope power supply voltage EPV. In one embodiment of the parallel amplifier power supply 40, the parallel amplifier power supply 40 provides the parallel amplifier power supply voltage PSV, such that the parallel amplifier power supply voltage PSV is greater than or equal to a sum of the source headroom voltage SRC (not shown) and a difference between the expected maximum 52 (FIG. 7) of the envelope power supply voltage EPV and the offset capacitive voltage OSV. In one embodiment of the source headroom voltage SRC (not shown), the source headroom voltage SRC (not shown) is equal to about 0.1 volts. If the expected maximum 52 (FIG. 7) of the envelope power supply voltage EPV is represented as EMX, the above requirement is shown in EQ. 2, below.

$$PSV>=SRC+EMX-OSV \qquad \text{EQ. 2}$$

In this regard, in one embodiment of the envelope tracking power supply 26, the offset capacitive voltage OSV is regulated to minimize a voltage drop between the parallel amplifier output PAO and the ground when the parallel amplifier 36 is sinking current. Further, in one embodiment of the envelope tracking power supply 26, the parallel amplifier power supply voltage PSV is regulated to minimize a voltage drop between the parallel amplifier output PAO and the parallel amplifier power supply 40 when the parallel amplifier 36 is sourcing current. Minimizing these voltage drops improves the efficiency of the envelope tracking power supply 26

In one embodiment of the switching supply 38, the switching supply 38 operates to drive an output current from the parallel amplifier 36 toward zero to maximize efficiency. The power supply control circuitry 34 is coupled to each of the parallel amplifier 36, the parallel amplifier power supply 40, the switching circuitry 42, and the offset capacitance voltage control loop 44. As such, in one embodiment of the power supply control circuitry 34, the power supply control circuitry 34 provides information and receives information from any or all of the parallel amplifier 36, the parallel amplifier power supply 40, the switching circuitry 42, and the offset capacitance voltage control loop 44, as needed.

The switching supply 38 and the parallel amplifier power supply 40 receive the DC source signal VDC from the DC power source 20 (FIG. 1). The parallel amplifier power supply 40 provides the parallel amplifier power supply signal LPS based on the DC source signal VDC. The power supply control circuitry 34 provides a parallel amplifier power supply select signal LPSS to the parallel amplifier power supply 40. The parallel amplifier power supply 40 selects one of a group of parallel amplifier supply voltages based on the parallel amplifier power supply select signal LPSS. The parallel amplifier power supply 40 provides the parallel amplifier power supply voltage PSV as the selected one of the group of parallel amplifier supply voltages.

Figure 5:
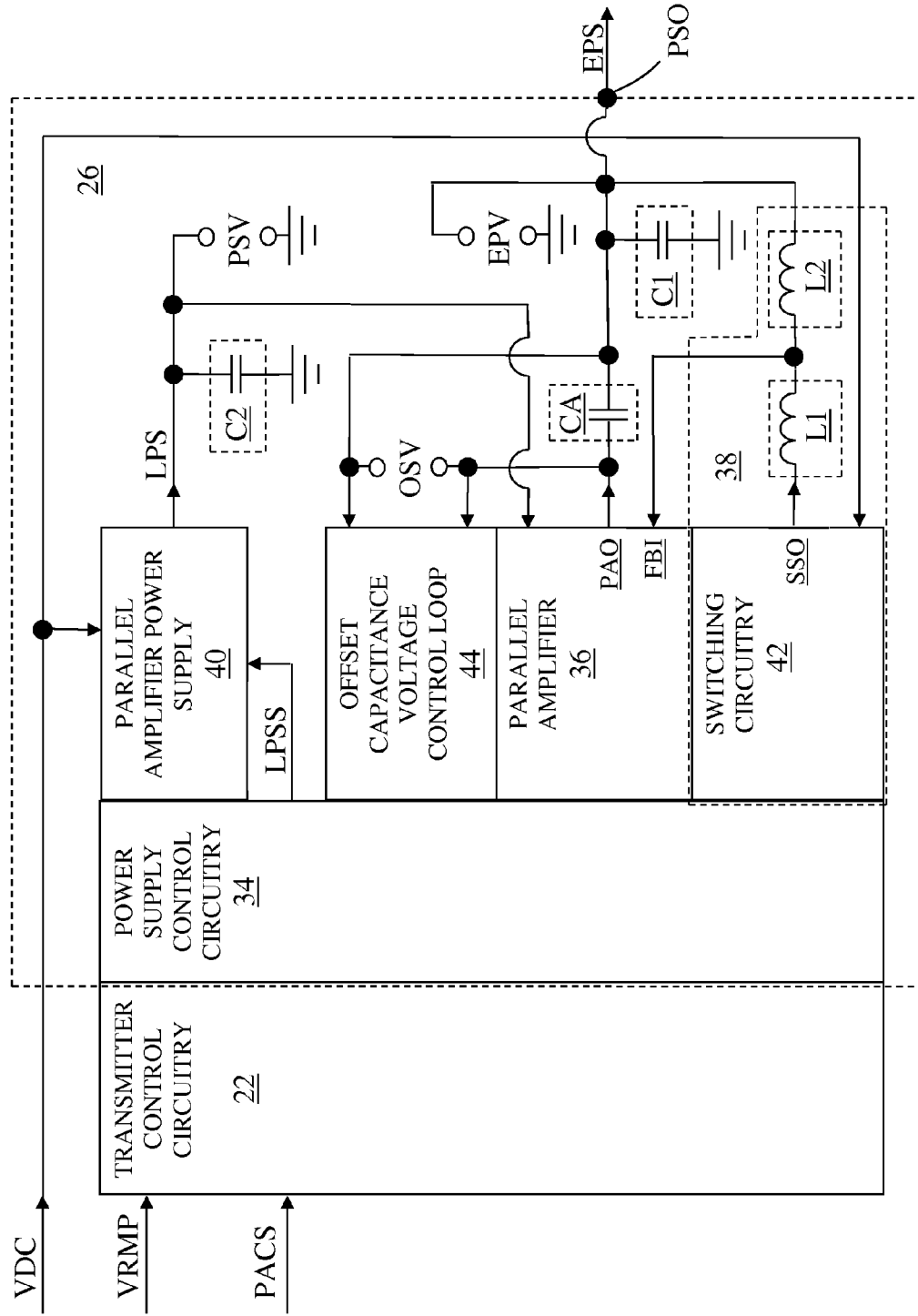
FIG. 5 shows details of the envelope tracking power supply illustrated in FIG. 1 according to an additional embodiment of the envelope tracking power supply.

FIG. 5 shows details of the envelope tracking power supply 26 illustrated in FIG. 1 according to an additional embodiment of the envelope tracking power supply 26. The envelope tracking power supply 26 illustrated in FIG. 5 is similar to the envelope tracking power supply 26 illustrated in FIG. 4, except the switching supply 38 illustrated in FIG. 5 further includes a second inductive element L2. Further, in the envelope tracking power supply 26 illustrated in FIG. 4, the first inductive element L1 is directly coupled between the switching circuitry output SSO and the envelope tracking power supply output PSO. However, in the envelope tracking power supply 26 illustrated in FIG. 5, the first inductive element L1 and the second inductive element L2 are coupled in series between the switching circuitry output SSO and the envelope tracking power supply output PSO. As such, the first inductive element L1 is directly coupled between the switching circuitry output SSO and the feedback input FBI, and the second inductive element L2 is directly coupled between the feedback input FBI and the envelope tracking power supply output PSO.

In one embodiment of the envelope tracking power supply 26, the series combination of the first inductive element L1 and the second inductive element L2 form a voltage divider, which provides a phase-shifted signal to the feedback input FBI. The voltage divider may compensate for bandwidth limitations in the parallel amplifier 36, thereby providing improved regulation of the envelope power supply voltage EPV. The first inductive element L1 has a first inductance and the second inductive element L2 has a second inductance.

In a first embodiment of the first inductive element L1 and the second inductive element L2, a ratio of the first inductance divided by the second inductance is greater than ten. In a second embodiment of the first inductive element L1 and the second inductive element L2, a ratio of the first inductance divided by the second inductance is greater than 100. In a third embodiment of the first inductive element L1 and the second inductive element L2, a ratio of the first inductance divided by the second inductance is greater than 500. In a fourth embodiment of the first inductive element L1 and the second inductive element L2, a ratio of the first inductance divided by the second inductance is greater than 1000. In a fifth embodiment of the first inductive element L1 and the second inductive element L2, a ratio of the first inductance divided by the second inductance is less than 5000.

Figure 6:
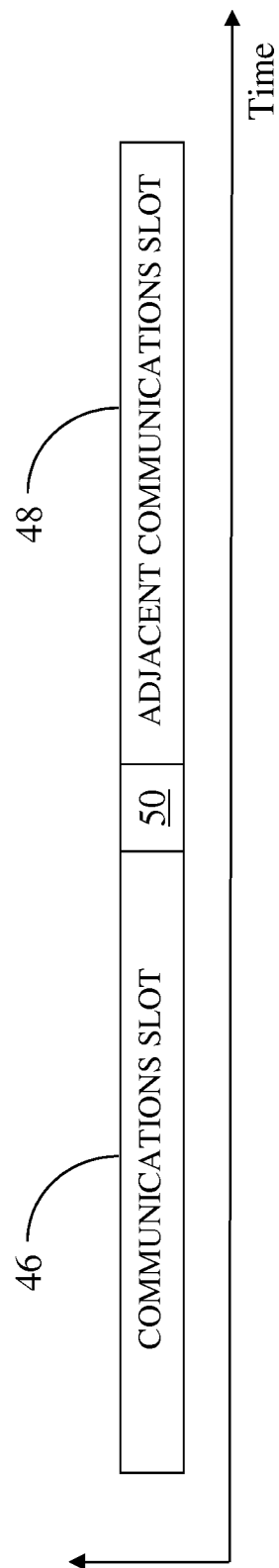
FIG. 6 is a graph illustrating communications slots associated with the RF communications system shown in FIG. 1 according to one embodiment of the RF communications system.

FIG. 6 is a graph illustrating multiple communications slots 46, 48 associated with the RF communications system 10 shown in FIG. 1 according to one embodiment of the RF communications system 10. In one embodiment of the RF communications system 10, the RF communications system 10 communicates with other RF communications systems (not shown) using the multiple communications slots 46, 48, which may include transmit communications slots, receive communications slots, simultaneous receive and transmit communications slots, or any combination thereof. The multiple communications slots 46, 48 may utilize the RF transmit signal RFT, the RF receive signal RFR, other RF signals (not shown), or any combination thereof.

The multiple communications slots 46, 48 include a communications slot 46 and an adjacent communications slot 48. In one embodiment of the communications slot 46, the communications slot 46 is a time period during which RF transmissions, RF receptions, or both, may occur. In one embodiment of the communications slot 46 and the adjacent communications slot 48, a slot boundary 50 is between the communications slot 46 and the adjacent communications slot 48. In one embodiment of the slot boundary 50, RF transmissions, RF receptions, or both, may be prohibited. As a result, during the slot boundary 50, the RF communications system 10 may prepare for RF transmissions, RF receptions, or both.

In one embodiment of the parallel amplifier power supply 40, the parallel amplifier power supply signal LPS may be adjusted during the slot boundary 50 and is prohibited from being adjusted during the communications slot 46 and during the adjacent communications slot 48. In this regard, the parallel amplifier power supply signal LPS is adjustable on a communications slot-to-communications slot basis. Further, in one embodiment of the offset capacitance voltage control loop 44, the offset capacitive voltage OSV may be adjusted during the slot boundary 50 and is prohibited from being adjusted during the communications slot 46 and during the adjacent communications slot 48. In this regard, the offset capacitive voltage OSV is adjustable on a communications slot-to-communications slot basis.

In one embodiment of the offset capacitance voltage control loop 44, to quickly adjust the offset capacitive voltage OSV and since the offset capacitive voltage OSV may be adjusted during the slot boundary 50, a bandwidth of the offset capacitance voltage control loop 44 during the slot boundary 50 is higher than the bandwidth of the offset capacitance voltage control loop 44 during the communications slots 46, 48.

Figure 8A:
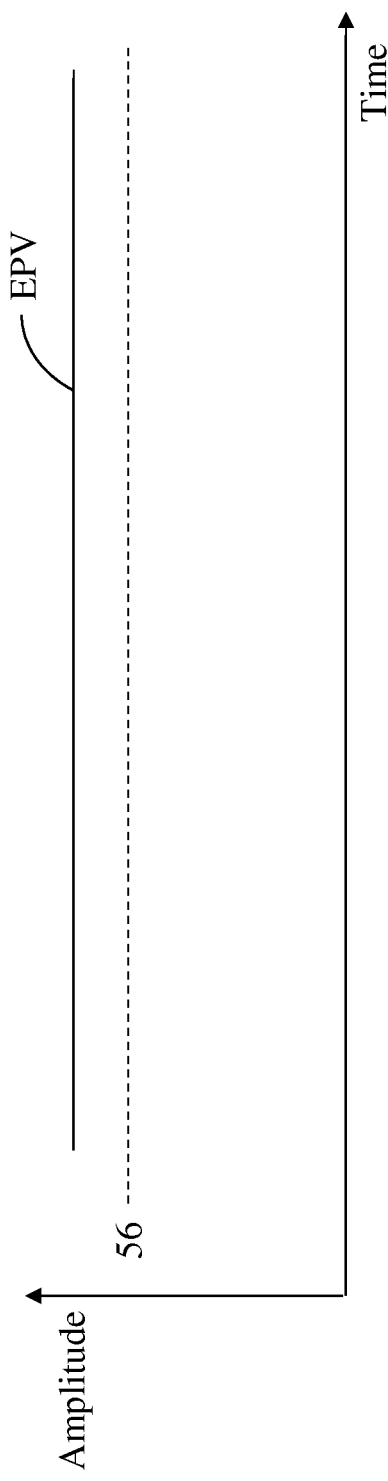
FIGS. 8A and 8B are graphs illustrating the envelope power supply voltage shown in FIG. 4 according to alternate embodiments, respectively, of the envelope power supply voltage.
Figure 8B:
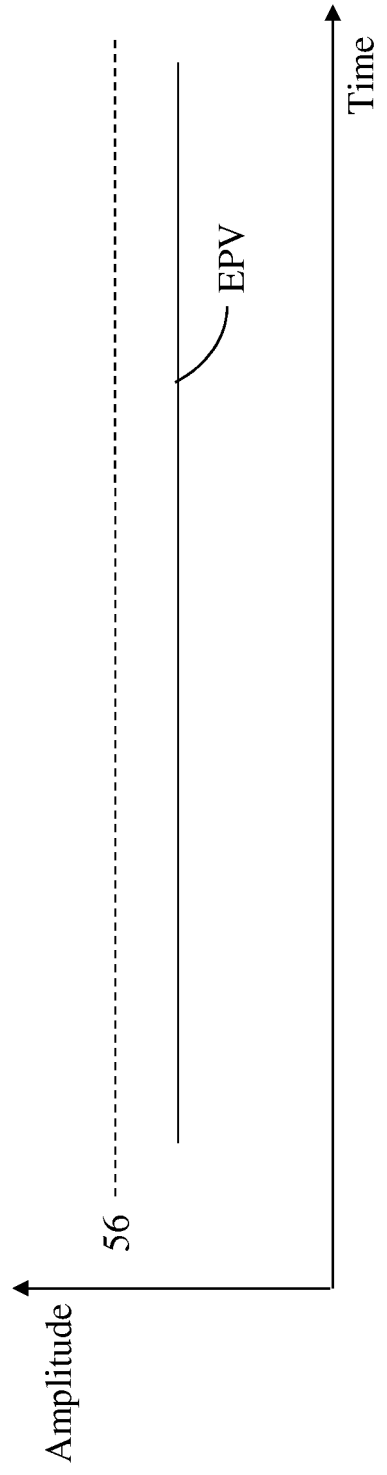

FIG. 7 is a graph illustrating the RF transmit signal RFT and the envelope power supply voltage EPV shown in FIGS. 1 and 4, respectively, according to one embodiment of the RF transmit signal RFT and the envelope power supply voltage EPV. Further, FIGS. 8A and 8B are graphs illustrating the envelope power supply voltage EPV shown in FIG. 4 according to alternate embodiments of the envelope power supply voltage EPV. In one embodiment of the envelope tracking power supply 26, the envelope tracking power supply 26 operates in one of an envelope tracking mode and an average power tracking mode. Selection of the one of an envelope tracking mode and an average power tracking mode may be made by the RF system control circuitry 14, the transmitter control circuitry 22, or the power supply control circuitry 34.

During envelope tracking, the envelope tracking power supply 26 operates in the envelope tracking mode. As such, during the envelope tracking mode, the envelope tracking power supply 26 provides the envelope power supply voltage EPV to the RF PA 24 via the envelope tracking power supply output PSO, such that the envelope power supply voltage EPV at least partially tracks the RF transmit signal RFT from the RF PA 24, shown in FIG. 7. In this regard, the RF transmit signal RFT is amplitude modulated and the envelope power supply voltage EPV at least partially follows an envelope of the RF transmit signal RFT, as shown. The envelope power supply voltage EPV has the expected maximum 52 and the expected minimum 54, as shown in FIG. 7.

In one embodiment of the envelope power supply voltage EPV and the RF transmit signal RFT, the expected maximum 52 of the envelope power supply voltage EPV is high enough to accommodate the envelope of the RF transmit signal RFT without causing significant distortion of the RF transmit signal RFT. In an alternate embodiment of the envelope power supply voltage EPV and the RF transmit signal RFT, the expected maximum 52 of the envelope power supply voltage EPV is low enough to cause clipping (not shown) of the envelope of the RF transmit signal RFT, thereby causing some distortion of the RF transmit signal RFT. However, if the distortion of the RF transmit signal RFT is small enough to allow compliance with communications standards, the clipping may be acceptable.

During average power tracking, the envelope tracking power supply 26 operates in the average power tracking mode. As such, during the average power tracking mode, the envelope tracking power supply 26 provides the envelope power supply voltage EPV to the RF PA 24 via the envelope tracking power supply output PSO, such that during a communications slot 46 (FIG. 6), the envelope power supply voltage EPV is about constant, as shown in FIGS. 8A and 8B.

In one embodiment of the envelope tracking power supply 26, during the average power tracking mode, the envelope power supply voltage EPV is above a voltage threshold 56, as shown in FIG. 8A. In one embodiment of the envelope tracking power supply 26, during the average power tracking mode, the envelope power supply voltage EPV is below the voltage threshold 56, as shown in FIG. 8B.

FIGS. 9A, 9B, and 9C show details of three different embodiments, respectively, of the parallel amplifier power supply 40 illustrated in FIG. 4. In general, the parallel amplifier power supply 40 receives the parallel amplifier power supply select signal LPSS and the DC source signal VDC and provides the parallel amplifier power supply signal LPS based on the parallel amplifier power supply select signal LPSS and the DC source signal VDC. The parallel amplifier power supply signal LPS has the parallel amplifier power supply voltage PSV, which is a selected one of the group of parallel amplifier supply voltages.

FIG. 9A shows a first embodiment of the parallel amplifier power supply 40. The parallel amplifier power supply 40 has a charge pump 58 and a multiplexer 60. The charge pump 58 receives the parallel amplifier power supply select signal LPSS and the DC source signal VDC and provides an output voltage from the charge pump 58 to the multiplexer 60 if the DC source voltage DCV (FIG. 1) is not the selected one of the group of parallel amplifier supply voltages, such that the output voltage from the charge pump 58 is based on the parallel amplifier power supply select signal LPSS and the DC source signal VDC. The multiplexer 60 receives the parallel amplifier power supply select signal LPSS, the DC source signal VDC, and the output voltage from the charge pump 58 and forwards either the DC source signal VDC or the output voltage from the charge pump 58 to provide the parallel amplifier power supply signal LPS based on the parallel amplifier power supply select signal LPSS. In this regard the selected one of the group of parallel amplifier supply voltages is either the forwarded DC source voltage DCV or the forwarded output voltage from the charge pump 58.

In an alternate embodiment of the parallel amplifier power supply 40, the multiplexer 60 is omitted, such that the charge pump 58 provides the parallel amplifier power supply signal LPS based on the parallel amplifier power supply select signal LPSS and the DC source signal VDC. As such, the parallel amplifier power supply voltage PSV is the selected one of the group of parallel amplifier supply voltages.

FIG. 9B shows a second embodiment of the parallel amplifier power supply 40. The parallel amplifier power supply 40 has a two flying capacitor-based charge pump 62, a first flying capacitive element CF1, a second flying capacitive element CF2, and the multiplexer 60. The first flying capacitive element CF1 and the second flying capacitive element CF2 are coupled to the two flying capacitor-based charge pump 62, which charges and discharges each of the first flying capacitive element CF1 and the second flying capacitive element CF2 as needed to provide a selected output voltage.

The two flying capacitor-based charge pump 62 receives the parallel amplifier power supply select signal LPSS and the DC source signal VDC and provides an output voltage from the two flying capacitor-based charge pump 62 to the multiplexer 60 if the DC source voltage DCV (FIG. 1) is not the selected one of the group of parallel amplifier supply voltages, such that the output voltage from the two flying capacitor-based charge pump 62 is based on the parallel amplifier power supply select signal LPSS and the DC source signal VDC. The multiplexer 60 receives the parallel amplifier power supply select signal LPSS, the DC source signal VDC, and the output voltage from the two flying capacitor-based charge pump 62 and forwards either the DC source signal VDC or the output voltage from the two flying capacitor-based charge pump 62 to provide the parallel amplifier power supply signal LPS based on the parallel amplifier power supply select signal LPSS. In this regard the selected one of the group of parallel amplifier supply voltages is either the forwarded DC source voltage DCV or the forwarded output voltage from the two flying capacitor-based charge pump 62.

FIG. 9C shows a third embodiment of the parallel amplifier power supply 40. The parallel amplifier power supply 40 has an inductor-based charge pump 64, a charge pump inductive element LC, and the multiplexer 60. The charge pump inductive element LC is coupled between the inductor-based charge pump 64 and the multiplexer 60.

The inductor-based charge pump 64 receives the parallel amplifier power supply select signal LPSS and the DC source signal VDC and provides an output voltage from the charge pump inductive element LC to the multiplexer 60 if the DC source voltage DCV (FIG. 1) is not the selected one of the group of parallel amplifier supply voltages, such that the output voltage from the charge pump inductive element LC is based on the parallel amplifier power supply select signal LPSS and the DC source signal VDC. The multiplexer 60 receives the parallel amplifier power supply select signal LPSS, the DC source signal VDC, and the output voltage from the charge pump inductive element LC and forwards either the DC source signal VDC or the output voltage from the charge pump inductive element LC to provide the parallel amplifier power supply signal LPS based on the parallel amplifier power supply select signal LPSS. In this regard the selected one of the group of parallel amplifier supply voltages is either the forwarded DC source voltage DCV or the forwarded output voltage from the charge pump inductive element LC.

Figure 10:
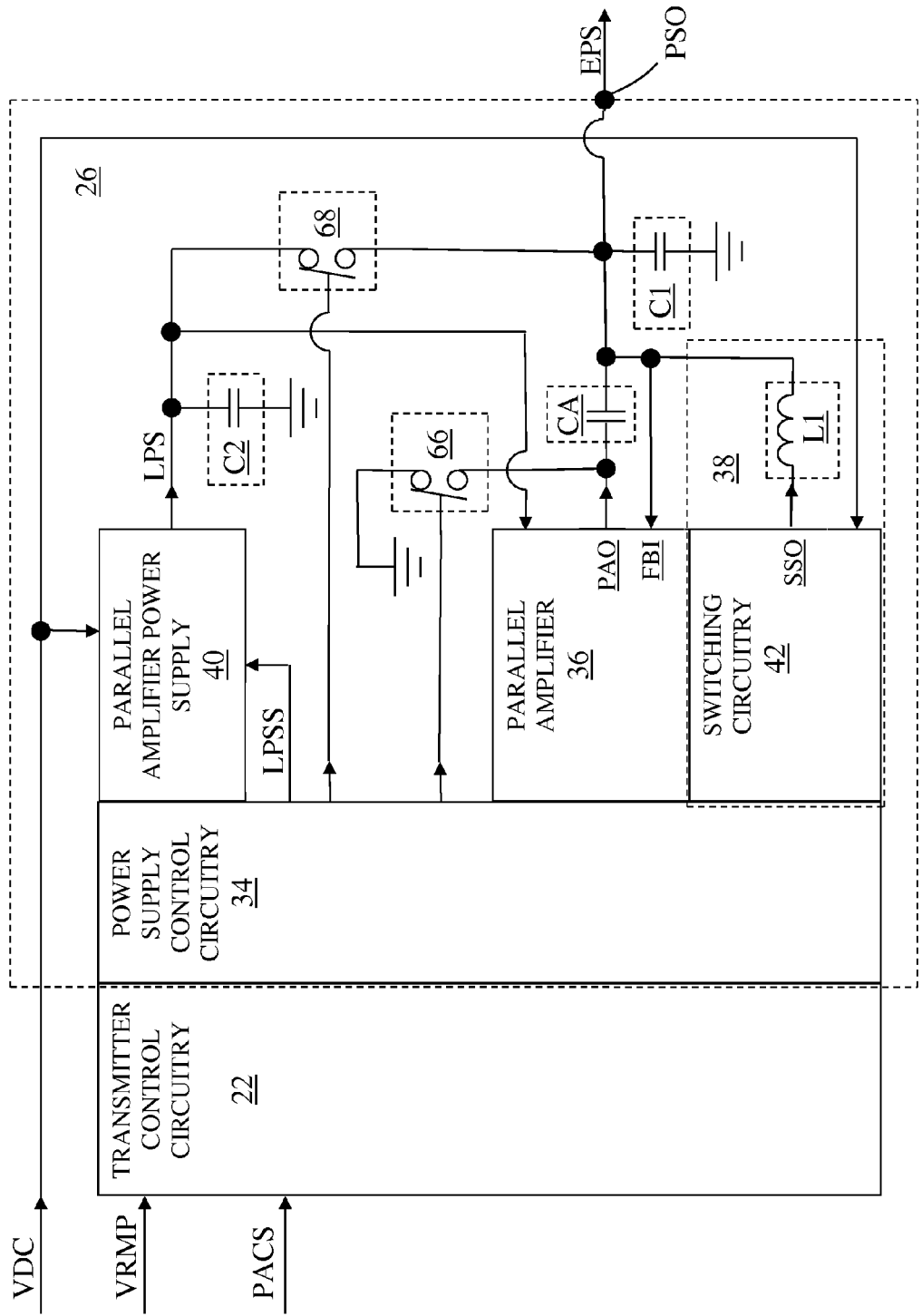
FIG. 10 shows details of the envelope tracking power supply illustrated in FIG. 1 according to another embodiment of the envelope tracking power supply.

FIG. 10 shows details of the envelope tracking power supply 26 illustrated in FIG. 1 according to another embodiment of the envelope tracking power supply 26. The envelope tracking power supply 26 illustrated in FIG. 10 is similar to the envelope tracking power supply 26 shown in FIG. 4, except the envelope tracking power supply 26 illustrated in FIG. 10 further includes a first switching element 66 and a second switching element 68, and the offset capacitance voltage control loop 44 is not shown for clarity. The first switching element 66 is coupled between the parallel amplifier output PAO and the ground. The second switching element 68 is coupled between the envelope tracking power supply output PSO and the output from the parallel amplifier power supply 40.

During the envelope tracking mode, the first switching element 66 is in an OPEN state and the second switching element 68 is in an OPEN state. Further, the parallel amplifier 36 is enabled, the switching circuitry 42 is enabled, and the parallel amplifier power supply 40 is enabled.

In one embodiment of the envelope tracking power supply 26, during the average power tracking mode, when the envelope power supply voltage EPV is above the voltage threshold 56 (FIG. 8A), the first switching element 66 is in a CLOSED state, the second switching element 68 is in the OPEN state, the parallel amplifier 36 is disabled, the parallel amplifier power supply 40 is disabled, and the switching circuitry 42 is enabled. Since the envelope power supply voltage EPV is constant and above the voltage threshold 56 (FIG. 8A), the parallel amplifier 36 and the parallel amplifier power supply 40 are not needed to vary the envelope power supply voltage EPV. Therefore, the switching circuitry 42 may provide the envelope power supply voltage EPV with high efficiency. Further, with the first switching element 66 in the CLOSED state, one end of the offset capacitive element CA is coupled to ground for stability.

In one embodiment of the envelope tracking power supply 26, during the average power tracking mode, when the envelope power supply voltage EPV is below the voltage threshold 56 (FIG. 8A), the first switching element 66 is in the CLOSED state, the second switching element 68 is in a CLOSED state, the parallel amplifier 36 is disabled, the parallel amplifier power supply 40 is enabled, and the switching circuitry 42 is disabled. Since the envelope power supply voltage EPV is constant and below the voltage threshold 56 (FIG. 8A), the parallel amplifier 36 is not needed to vary the envelope power supply voltage EPV. Further, the parallel amplifier power supply 40 may provide the envelope power supply voltage EPV with higher efficiency than the switching circuitry 42.

Figure 11:
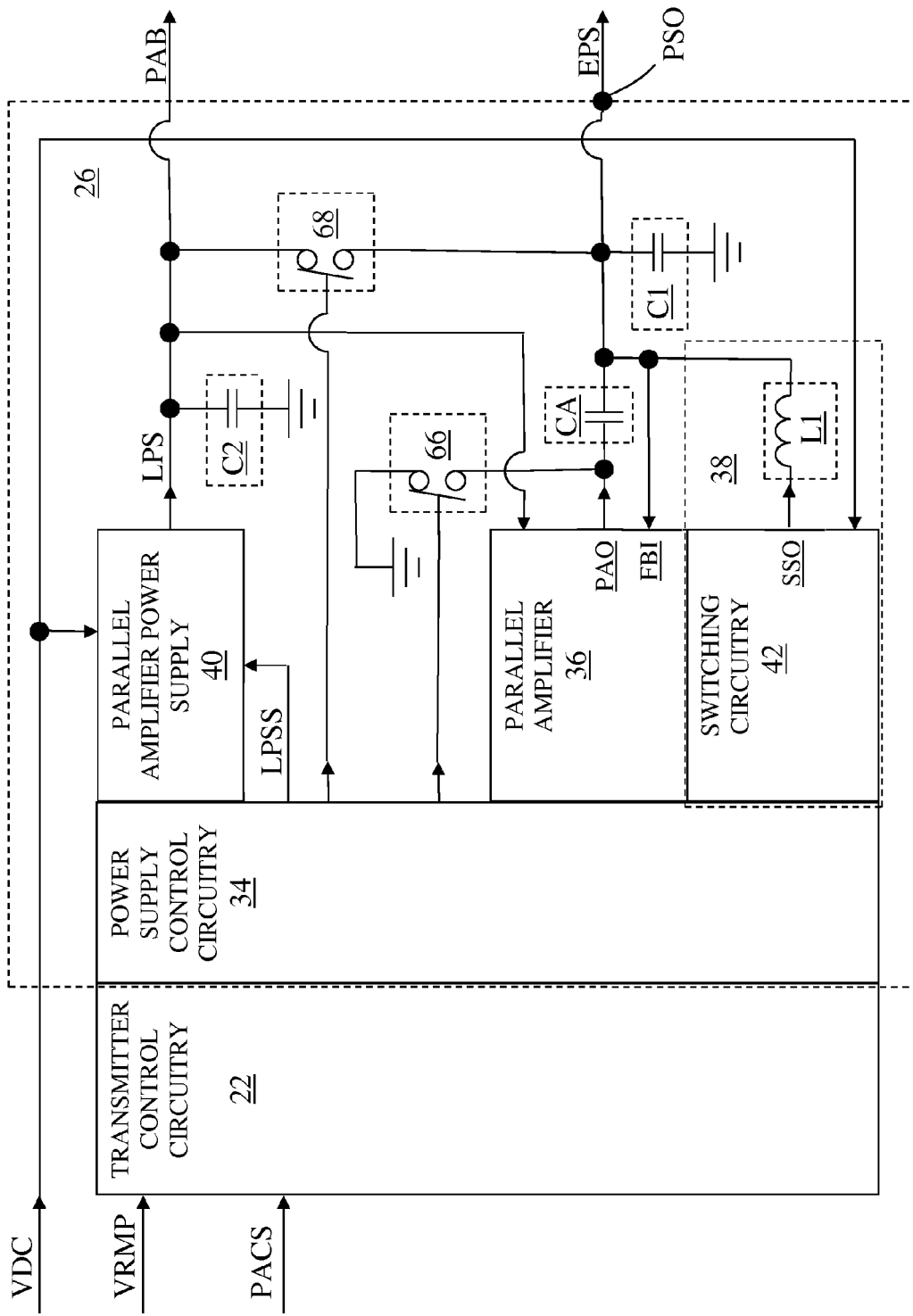
FIG. 11 shows details of the envelope tracking power supply illustrated in FIG. 1 according to a further embodiment of the envelope tracking power supply.

FIG. 11 shows details of the envelope tracking power supply 26 illustrated in FIG. 1 according to a further embodiment of the envelope tracking power supply 26. The envelope tracking power supply 26 illustrated in FIG. 11 is similar to the envelope tracking power supply 26 shown in FIG. 10, except in the envelope tracking power supply 26 illustrated in FIG. 10, the PA bias signal PAB is based on the parallel amplifier power supply signal LPS.

In one embodiment of the envelope tracking power supply 26, during the envelope tracking mode, the first switching element 66 is in the OPEN state and the second switching element 68 is in the OPEN state. Further, the parallel amplifier 36 is enabled, the switching circuitry 42 is enabled, and the parallel amplifier power supply 40 is enabled, such that the PA bias signal PAB is based on the parallel amplifier power supply signal LPS.

In one embodiment of the envelope tracking power supply 26, during the average power tracking mode, when the envelope power supply voltage EPV is above the voltage threshold 56 (FIG. 8A), the first switching element 66 is in a CLOSED state, the second switching element 68 is in the OPEN state, the parallel amplifier 36 is disabled, the parallel amplifier power supply 40 is enabled, and the switching circuitry 42 is enabled. Since the envelope power supply voltage EPV is constant and above the voltage threshold 56 (FIG. 8A), the parallel amplifier 36 and the parallel amplifier power supply 40 are not needed to vary the envelope power supply voltage EPV. However, the parallel amplifier power supply 40 must be enabled to provide the PA bias signal PAB. Further, the switching circuitry 42 may provide the envelope power supply voltage EPV with high efficiency. With the first switching element 66 in the CLOSED state, one end of the offset capacitive element CA is coupled to ground for stability.

In one embodiment of the envelope tracking power supply 26, during the average power tracking mode, when the envelope power supply voltage EPV is below the voltage threshold 56 (FIG. 8A), the first switching element 66 is in the CLOSED state, the second switching element 68 is in the CLOSED state, the parallel amplifier 36 is disabled, the parallel amplifier power supply 40 is enabled, and the switching circuitry 42 is disabled. Since the envelope power supply voltage EPV is constant and below the voltage threshold 56 (FIG. 8A), the parallel amplifier 36 is not needed to vary the envelope power supply voltage EPV. Further, the parallel amplifier power supply 40 may provide the envelope power supply voltage EPV with higher efficiency than the switching circuitry 42. Also, the PA bias signal PAB is based on the parallel amplifier power supply signal LPS.

Those skilled in the art will recognize improvements and modifications to the embodiments of the present disclosure. All such improvements and modifications are considered within the scope of the concepts disclosed herein and the claims that follow.

What is claimed is:

1. Power supply circuitry comprising:
   a parallel amplifier having a parallel amplifier output coupled to an envelope tracking power supply output via an offset capacitive element, which is configured to have an offset capacitive voltage; and
   an offset capacitance voltage control loop configured to regulate the offset capacitive voltage, which is adjustable on a communications slot-to-communications slot basis.

2. The power supply circuitry of claim 1 further comprising a parallel amplifier power supply configured to provide a parallel amplifier power supply signal, such that the parallel amplifier is configured to regulate an envelope power supply voltage based on the parallel amplifier power supply signal.

3. The power supply circuitry of claim 1 wherein a bandwidth of the offset capacitance voltage control loop between adjacent communications slots is configured to be higher than a bandwidth of the offset capacitance voltage control loop during a communications slot.

4. The power supply circuitry of claim 1 wherein during at least one communications slot an average DC current through the offset capacitive element is equal to about zero.

5. The power supply circuitry of claim 1 further comprising switching circuitry having a switching circuitry output, wherein:
   the switching circuitry output is coupled to the envelope tracking power supply output via a first inductive element;
   an envelope tracking power supply has the envelope tracking power supply output and comprises the parallel amplifier, the switching circuitry, the offset capacitance voltage control loop, the first inductive element, and the offset capacitive element; and
   the envelope tracking power supply is configured to provide an envelope power supply voltage to a radio frequency power amplifier via the envelope tracking power supply output, such that during envelope tracking, the envelope power supply voltage at least partially envelope tracks a radio frequency transmit signal from the radio frequency power amplifier.

6. The power supply circuitry of claim 5 further comprising a parallel amplifier power supply configured to provide a parallel amplifier power supply signal, wherein for at least one communications slot, the parallel amplifier power supply signal is based on an expected maximum and an expected minimum of the envelope power supply voltage.

7. The power supply circuitry of claim 6 wherein the offset capacitive voltage is based on the expected minimum of the envelope power supply voltage.

8. The power supply circuitry of claim 7 wherein the parallel amplifier output has a sink headroom voltage, such that the offset capacitive voltage is less than or equal to a difference between the expected minimum of the envelope power supply voltage and the sink headroom voltage.

9. The power supply circuitry of claim 8 wherein the sink headroom voltage is equal to about 0.2 volts.

10. The power supply circuitry of claim 7 wherein the parallel amplifier power supply signal has a parallel amplifier power supply voltage, such that during the at least one communications slot, the parallel amplifier power supply voltage is based on a difference between the expected maximum of the envelope power supply voltage and the expected minimum of the envelope power supply voltage.

11. The power supply circuitry of claim 10 wherein the parallel amplifier output has a source headroom voltage, such that during the at least one communications slot, the parallel amplifier power supply voltage is greater than or equal to a sum of the source headroom voltage and a difference between the expected maximum of the envelope power supply voltage and the offset capacitive voltage.

12. The power supply circuitry of claim 11 wherein the expected maximum of the envelope power supply voltage is low enough to clip the radio frequency transmit signal from the radio frequency power amplifier.

13. The power supply circuitry of claim 6 wherein the parallel amplifier power supply is further configured to receive a DC source signal from a DC power source and further provide the parallel amplifier power supply signal based on the DC source signal.

14. The power supply circuitry of claim 13 wherein the DC power source is a battery.

15. The power supply circuitry of claim 13 wherein the parallel amplifier power supply comprises a two flying capacitor-based charge pump.

16. The power supply circuitry of claim 13 wherein the parallel amplifier power supply comprises an inductor-based charge pump.

17. The power supply circuitry of claim 13 wherein:
the envelope tracking power supply is further configured to operate in one of an envelope tracking mode and an average power tracking mode;
during the envelope tracking mode, the envelope tracking power supply is further configured to provide the envelope power supply voltage to the radio frequency power amplifier via the envelope tracking power supply output, such that the envelope power supply voltage at least partially envelope tracks the radio frequency transmit signal from the radio frequency power amplifier; and
during the average power tracking mode, the envelope tracking power supply is further configured to provide the envelope power supply voltage to the radio frequency power amplifier via the envelope tracking power supply output, such that during a communications slot the envelope power supply voltage is about constant.

18. The power supply circuitry of claim 17 wherein during the envelope tracking mode:
the parallel amplifier is enabled;
the switching circuitry is enabled; and
the parallel amplifier power supply is enabled.

19. The power supply circuitry of claim 18 wherein the radio frequency power amplifier is configured to receive a power amplifier bias signal, which is based on the parallel amplifier power supply signal.

20. The power supply circuitry of claim 17 wherein during the average power tracking mode and when the envelope power supply voltage is above a voltage threshold:
the parallel amplifier is disabled;
the switching circuitry is enabled; and
the parallel amplifier power supply is enabled, such that the radio frequency power amplifier is configured to receive a power amplifier bias signal, which is based on the parallel amplifier power supply signal.

21. The power supply circuitry of claim 17 wherein during the average power tracking mode and when the envelope power supply voltage is above a voltage threshold:
the parallel amplifier is disabled;
the switching circuitry is enabled; and
the parallel amplifier power supply is disabled.

22. The power supply circuitry of claim 17 wherein during the average power tracking mode and when the envelope power supply voltage is below a voltage threshold:
the parallel amplifier is disabled;
the switching circuitry is disabled; and
the parallel amplifier power supply is enabled, such that the envelope power supply voltage is based on the parallel amplifier power supply signal.

23. The power supply circuitry of claim 22 wherein the radio frequency power amplifier is configured to receive a power amplifier bias signal, which is based on the parallel amplifier power supply signal.

24. The power supply circuitry of claim 5 wherein:
the offset capacitive element is directly coupled between the parallel amplifier output and the envelope tracking power supply output; and
the first inductive element is directly coupled between the switching circuitry output and the envelope tracking power supply output.

25. The power supply circuitry of claim 5 wherein:
the parallel amplifier further has a feedback input;
the offset capacitive element is directly coupled between the parallel amplifier output and the envelope tracking power supply output;
the first inductive element is directly coupled between the switching circuitry output and the feedback input; and
a second inductive element is directly coupled between the feedback input and the envelope tracking power supply output.

26. The power supply circuitry of claim 25 wherein the first inductive element has a first inductance and the second inductive element has a second inductance, such that a ratio of the first inductance divided by the second inductance is greater than ten.

27. The power supply circuitry of claim 5 wherein a first filter capacitive element is coupled between the envelope tracking power supply output and a ground.

28. A method comprising:
providing a parallel amplifier having a parallel amplifier output coupled to an envelope tracking power supply output via an offset capacitive element, which is configured to have an offset capacitive voltage; and
regulating the offset capacitive voltage, which is adjustable on a communications slot-to-communications slot basis.

* * * * *